(12) United States Patent
Abhijeet et al.

(10) Patent No.: US 10,698,778 B2
(45) Date of Patent: Jun. 30, 2020

(54) AUTOMATED STALLED PROCESS DETECTION AND RECOVERY

(71) Applicant: International Business Machines Corporation, Armonk, NY (US)

(72) Inventors: Kumar Abhijeet, Chicago, IL (US); Andrew D. Baptist, Mt. Pleasant, WI (US); Ilir Iljazi, Chicago, IL (US); Gregory A. Papadopoulos, Chicago, IL (US); Jason K. Resch, Chicago, IL (US)

(73) Assignee: PURE STORAGE, INC., Mountain View, CA (US)

( * ) Notice: Subject to any disclaimer, the term of this patent is extended or adjusted under 35 U.S.C. 154(b) by 3 days.

(21) Appl. No.: 16/237,903

(22) Filed: Jan. 2, 2019

(65) Prior Publication Data

US 2019/0155706 A1    May 23, 2019

Related U.S. Application Data

(63) Continuation of application No. 15/424,978, filed on Feb. 6, 2017, now Pat. No. 10,216,594, which is a continuation-in-part of application No. 15/058,408, filed on Mar. 2, 2016, now Pat. No. 10,037,171.

(60) Provisional application No. 62/154,886, filed on Apr. 30, 2015.

(51) Int. Cl.
*G06F 11/20* (2006.01)
*G11C 29/48* (2006.01)
*G06F 11/10* (2006.01)
*G06F 3/06* (2006.01)

(52) U.S. Cl.
CPC .......... *G06F 11/2053* (2013.01); *G06F 3/064* (2013.01); *G06F 3/067* (2013.01); *G06F 3/0619* (2013.01); *G06F 11/1092* (2013.01); *G11C 29/48* (2013.01); *G06F 2201/805* (2013.01); *G06F 2201/82* (2013.01); *G06F 2211/1028* (2013.01)

(58) Field of Classification Search
CPC .................................................. G06F 11/2053
USPC ................................ 714/763, 768, 765, 767
See application file for complete search history.

(56) References Cited

U.S. PATENT DOCUMENTS

| | | |
|---|---|---|
| 4,092,732 A | 5/1978 | Ouchi |
| 5,454,101 A | 9/1995 | Mackay et al. |
| 5,485,474 A | 1/1996 | Rabin |
| 5,717,850 A | 2/1998 | Apperley et al. |
| 5,774,643 A | 6/1998 | Lubbers et al. |
| 5,802,364 A | 9/1998 | Senator et al. |
| 5,809,285 A | 9/1998 | Hilland |

(Continued)

OTHER PUBLICATIONS

Chung; An Automatic Data Segmentation Method for 3D Measured Data Points; National Taiwan University; pp. 1-8; 1998.

(Continued)

*Primary Examiner* — Fritz Alphonse
(74) *Attorney, Agent, or Firm* — Garlick & Markison; Edward J. Marshall

(57) ABSTRACT

A dispersed storage network (DSN) includes multiple storage units. A processing unit included in the DSN issues an access request to one of the storage units, and identifies the storage unit as a failing storage unit based, at least in part, on a rate of growth of a network queue associated with the storage unit. the processing unit then issues an error indicator to a recovery unit for further action.

20 Claims, 6 Drawing Sheets

(56) References Cited

U.S. PATENT DOCUMENTS

| | | | |
|---|---|---|---|
| 5,815,649 A | 9/1998 | Utter et al. | |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,353,895 B1 | 3/2002 | Stephenson | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 7,685,360 B1 | 3/2010 | Brunnett et al. | |
| 8,386,834 B1 | 2/2013 | Goel et al. | |
| 2002/0062422 A1 | 5/2002 | Butterworth et al. | |
| 2002/0161972 A1 | 10/2002 | Talagala et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0065656 A1 | 4/2003 | de la Torre et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma | |
| 2005/0100022 A1 | 5/2005 | Ramprashad | |
| 2005/0102603 A1 | 5/2005 | Tapper et al. | |
| 2005/0114594 A1 | 5/2005 | Corbett et al. | |
| 2005/0125593 A1 | 6/2005 | Karpoff et al. | |
| 2005/0131993 A1 | 6/2005 | Fatula | |
| 2005/0132070 A1 | 6/2005 | Redlich et al. | |
| 2005/0144382 A1 | 6/2005 | Schmisseur | |
| 2005/0229069 A1 | 10/2005 | Hassner et al. | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0184740 A1* | 8/2006 | Ishikawa | G06F 12/084 711/129 |
| 2006/0224603 A1 | 10/2006 | Correll | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Soran et al. | |
| 2007/0283167 A1 | 12/2007 | Venters et al. | |
| 2009/0094251 A1 | 4/2009 | Gladwin et al. | |
| 2009/0094318 A1 | 4/2009 | Gladwin et al. | |
| 2009/0254572 A1* | 10/2009 | Redlich | G06Q 10/06 |
| 2010/0023524 A1 | 1/2010 | Gladwin et al. | |
| 2013/0254284 A1* | 9/2013 | Dougherty | G06F 21/00 709/204 |
| 2013/0321562 A1 | 12/2013 | Takahashi | |
| 2015/0110116 A1 | 4/2015 | Gong | |
| 2016/0004586 A1 | 1/2016 | Bangole et al. | |
| 2017/0124167 A1* | 5/2017 | Pasupathy | G06F 16/26 |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): the Protocol; IETF Network Working Group; RFC 1511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): String Representation of Search Filters; IETF Network Working Group; RFC 4515; Jun. 2006; pp. 1-12.

Smith; Lightweight Directory Access Protocol (LDAP): Uniform Resource Locator; IETF Network Working Group; RFC 4516; Jun. 2006; pp. 1-15.

Wildi; Java iSCSi Initiator; Master Thesis; Department of Computer and Information Science, University of Konstanz; Feb. 2007; 60 pgs.

Xin, et al.; Evaluation of Distributed Recovery in Large-Scale Storage Systems; 13th IEEE International Symposium on High Performance Distributed Computing; Jun. 2004; pp. 172-181.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): Directory Information Models; IETF Network Working Group; RFC 4512; Jun. 2006; pp. 1-49.

Zeilenga; Lightweight Directory Access Protocol (LDAP): Internationalized String Preparation; IETF Network Working Group; RFC 4518; Jun. 2006; pp. 1-14.

Zeilenga; Lightweight Directory Access Protocol (LDAP): String Representation of Distinguished Names; IETF Network Working Group; RFC 4514; Jun. 2006; pp. 1-15.

* cited by examiner

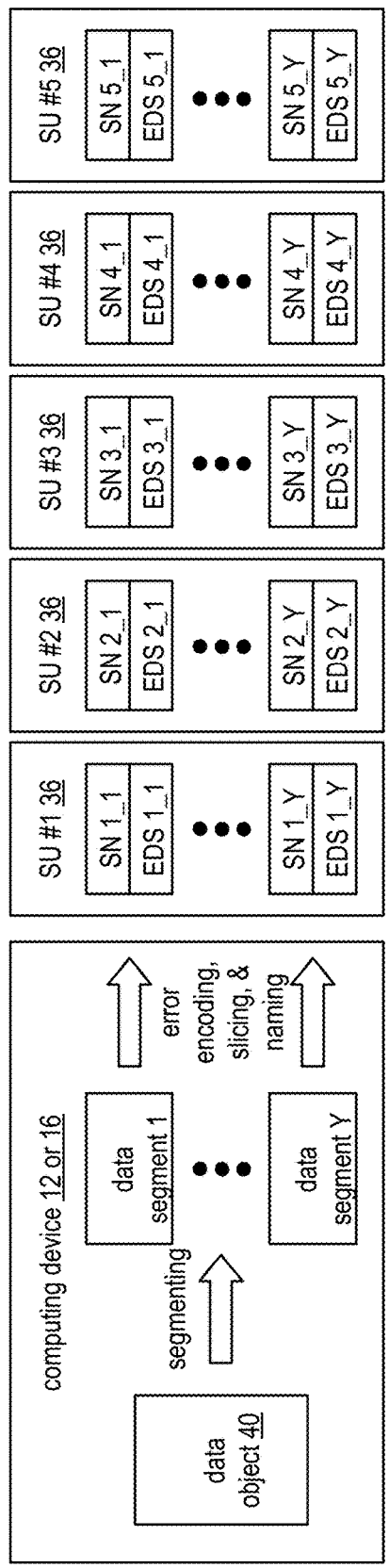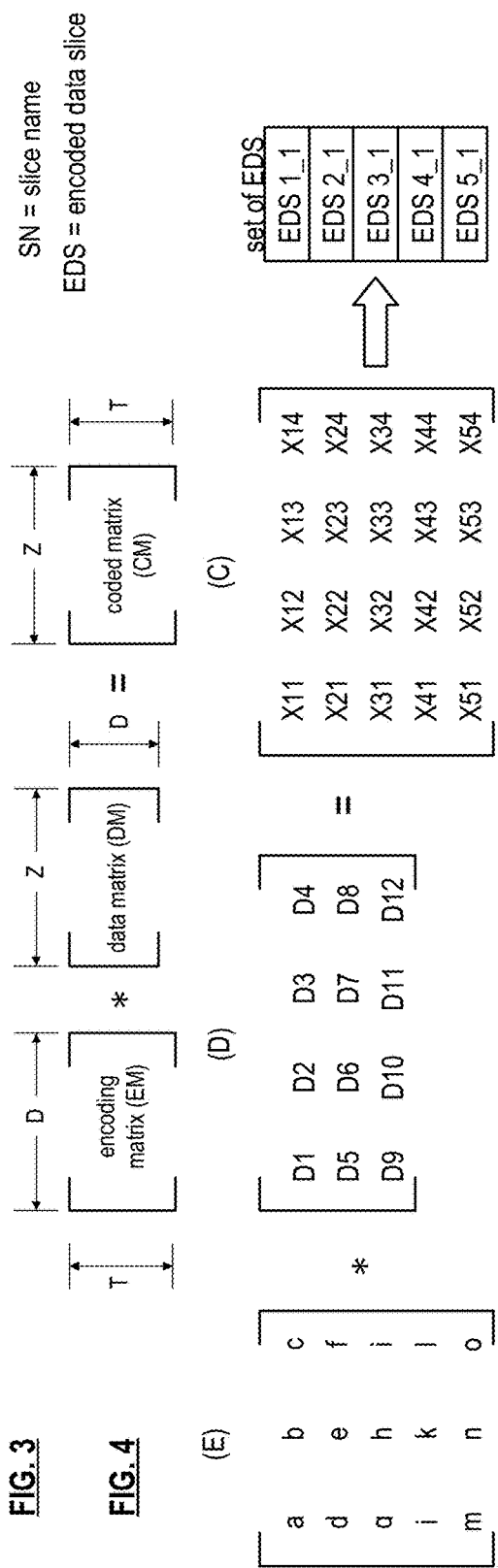

AUTOMATED STALLED PROCESS DETECTION AND RECOVERY

CROSS-REFERENCE TO RELATED APPLICATIONS

The present U.S. Utility Patent Application claims priority pursuant to 35 U.S.C. § 120 as a continuation of U.S. Utility application Ser. No. 15/424,978, entitled "AUTOMATED STALLED PROCESS DETECTION AND RECOVERY," filed Feb. 6, 2017, which is a continuation-in-part of U.S. Utility application Ser. No. 15/058,408, entitled "ACCESSING COMMON DATA IN A DISPERSED STORAGE NETWORK," filed Mar. 2, 2016, issued as U.S. Pat. No. 10,037,171 on Jul. 31, 2018, which claims priority pursuant to 35 U. S.C. § 119(e) to U.S. Provisional Application No. 62/154,886, entitled "BALANCING MAINTENANCE AND ACCESS TASKS IN A DISPERSED STORAGE NETWORK," filed Apr. 30, 2015, which is hereby incorporated herein by reference in its entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

As those of ordinary skill in the art are well aware, particular storage devices within a storage system may appear to be healthy and functioning, but in reality are unresponsive due to conditions such as kernel hangs, deadlocks, killed threads or processes, software defects, and hardware errors. Unfortunately, conventional systems may not provide an efficient and effective way to handle unresponsive, or semi-responsive storage devices.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE INVENTION

Figure 1:
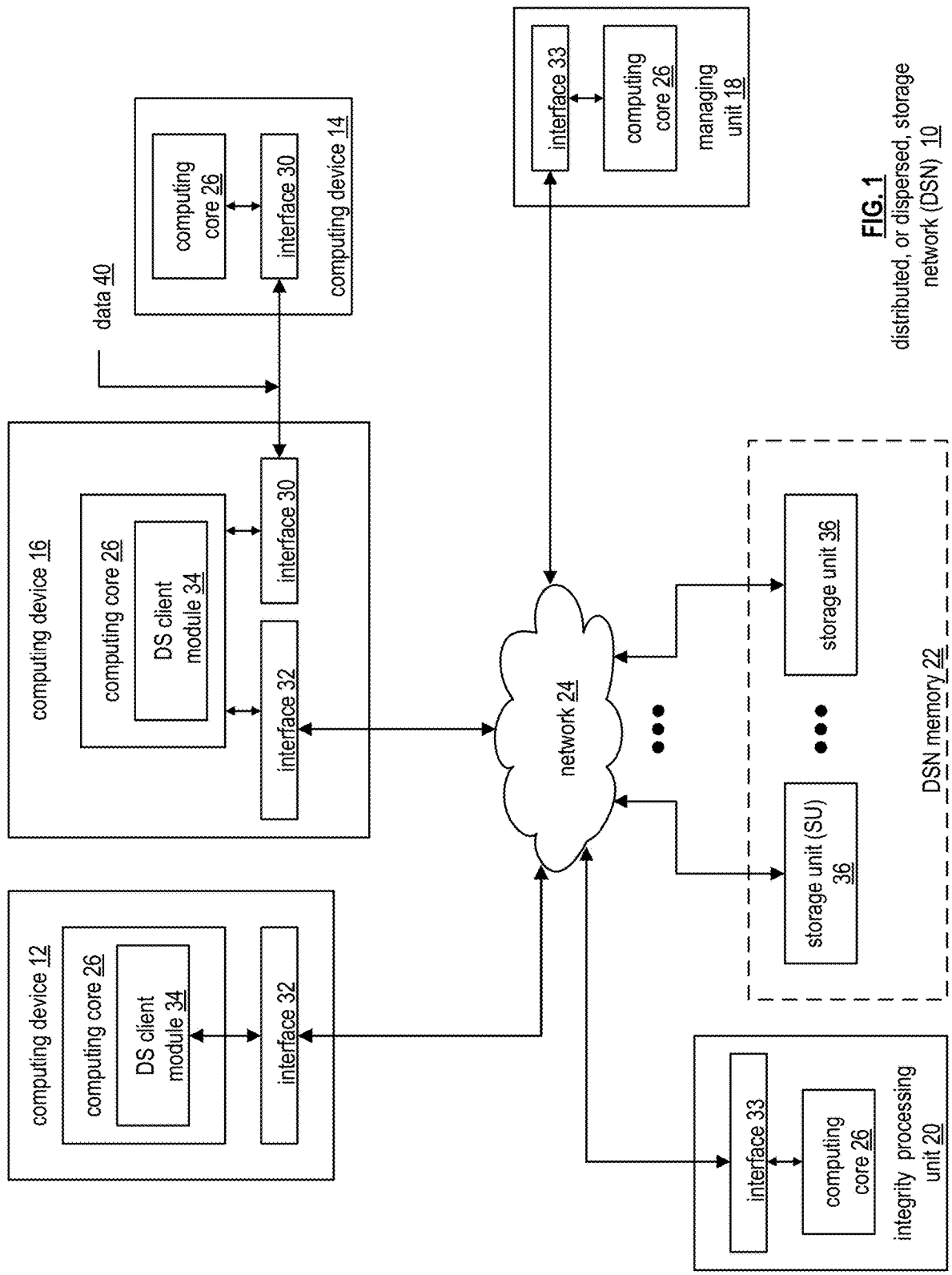
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public interne systems; and/or one or more local area networks (LAN) and/or wide area networks (WAN).

Figure 2:
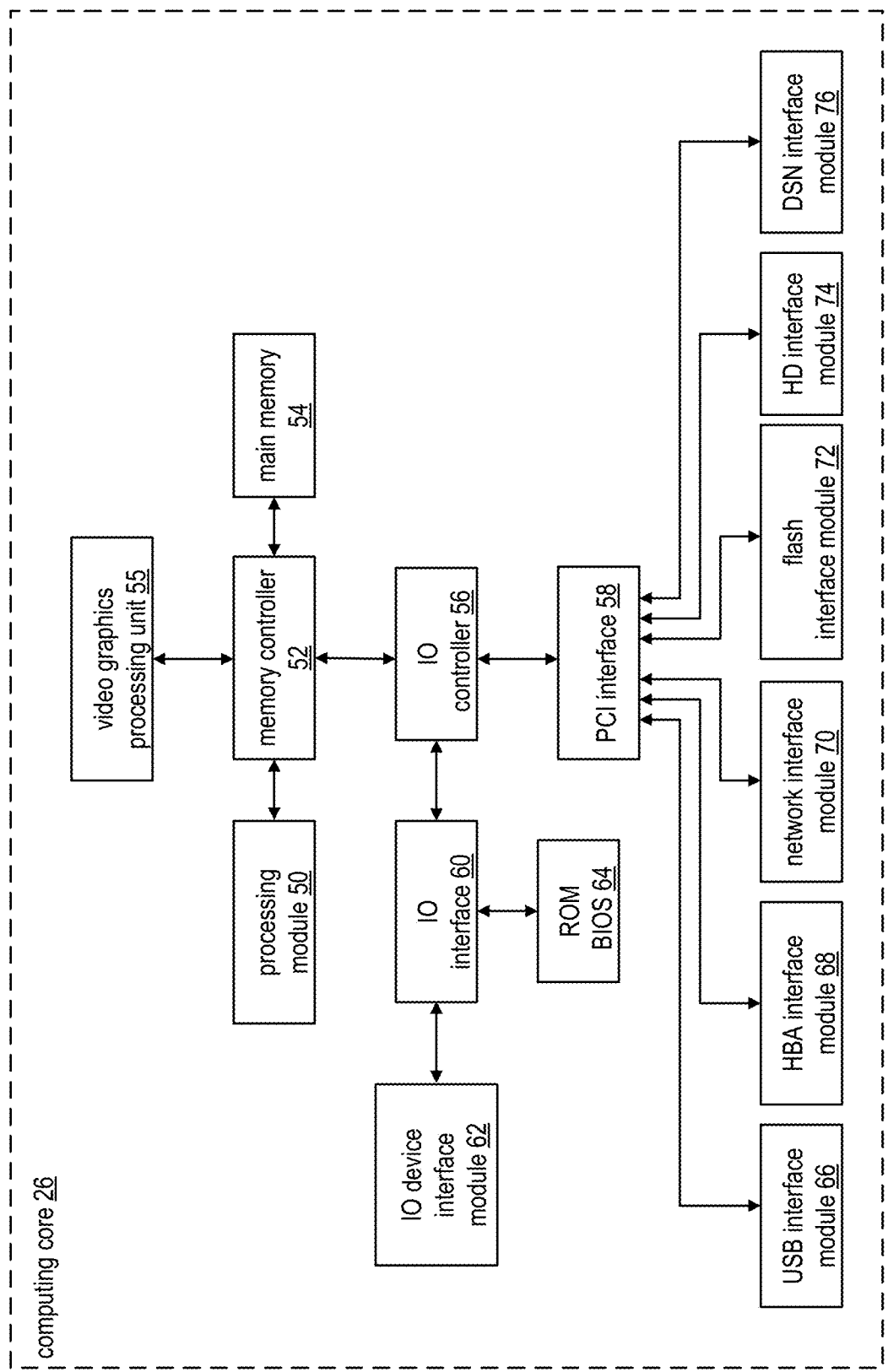
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
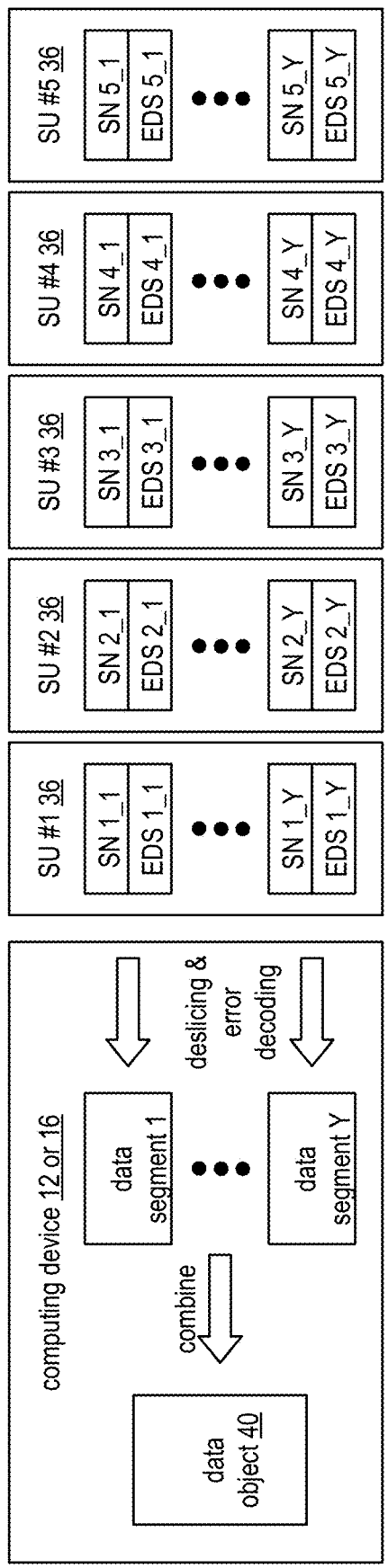
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
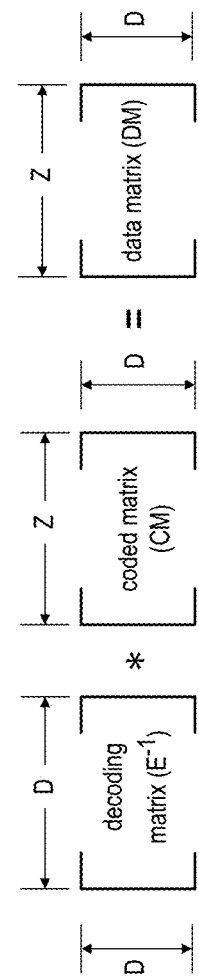
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
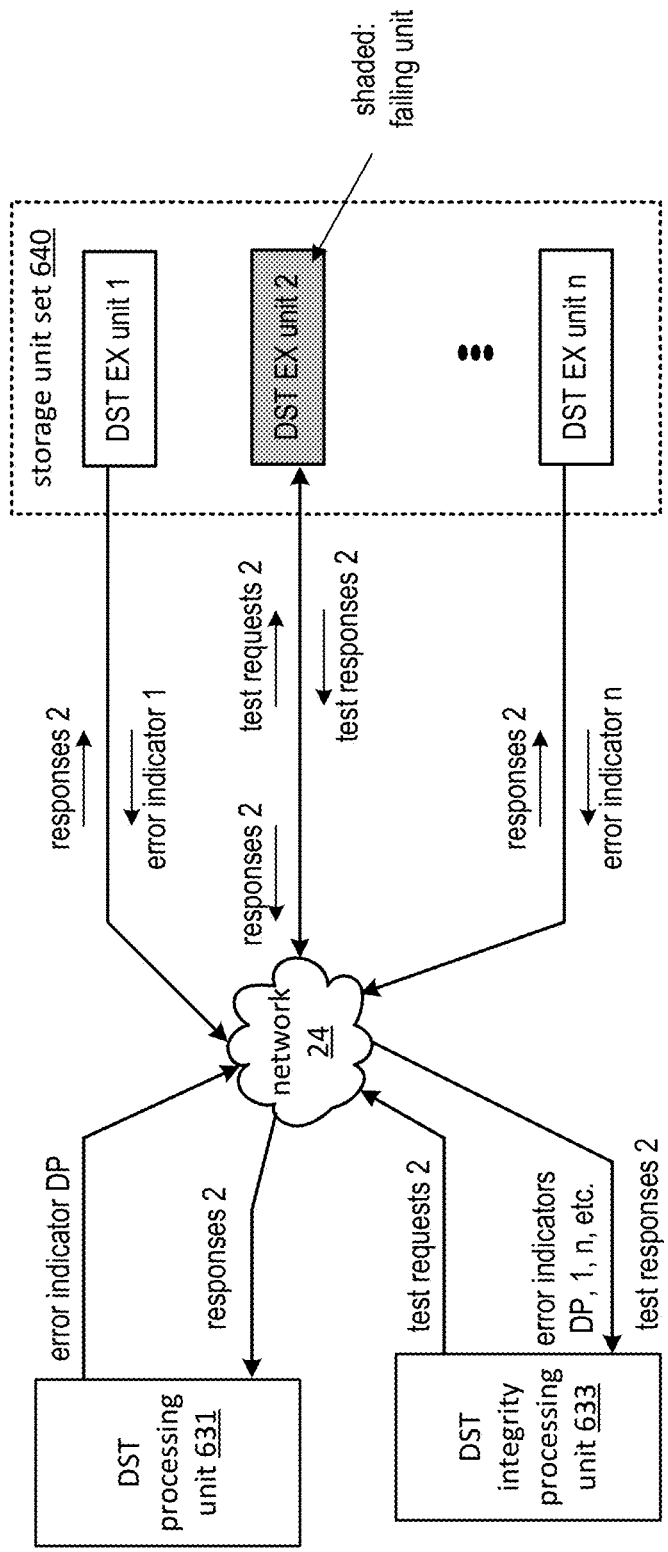
FIG. 9 is a schematic block diagram of another embodiment of a dispersed storage network (DSN) in accordance with the present invention.
Figure 10:
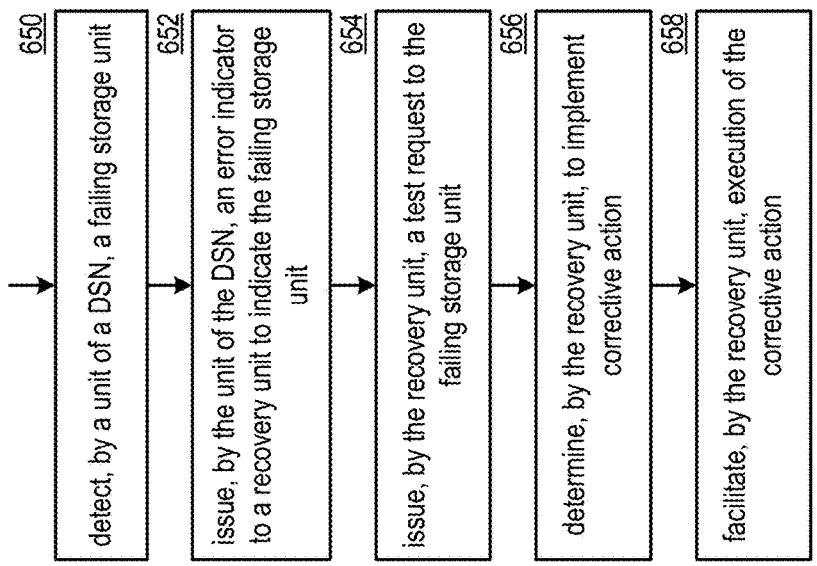
FIG. 10 is a flowchart illustrating an example of maintaining storage unit operation in accordance with the present invention.

Referring next to FIGS. 9 and 10, various embodiments providing automated stalled process detection and recovery are discussed. Numerous conditions can cause a distributed storage unit (DS unit) to enter a semi- or non-responsive state, where the unit seems to be healthy and functioning but stops responding to requests. Such a condition may be caused by any of a myriad of situations, including kernel hangs, deadlocks, killed threads or processes, software defects, and hardware errors.

Detection of conditions causing a storage unit to become non-responsive or semi-responsive often cannot be accomplished internal to the DS unit, as the DS unit in the errored condition cannot be expected to behave properly in the detection of its own errored condition. Therefore, external agents which interact with the DS unit can be used to monitor for, detect, report, and correct these conditions. For example, DS units that send listing or rebuild related requests to each other might detect an error condition of another DS unit if that DS unit fails to send any kind of response for some extended period of time. Or a DS processing unit, writing to or reading from a DS unit, may notice a network queue to a non-responsive DS unit begin to grow rapidly as the DS unit fails to respond to some or all requests.

When a failing condition is detected, it is reported to an entity trusted with the authority to recover the DS unit out of that condition. This entity, when it receives a report of a suspected failing storage unit, can attempt to verify the condition by issuing test requests against the reported DS unit. If the DS unit fails to adequately respond to those test requests, then its status is confirmed, and a corrective action may be taken. The corrective action may include a software process restart, a power cycle, reseating of memory devices, or other such actions. Following the recovery attempt, the trusted entity may attempt to verify that it has recovered. If it has not, another corrective action may be taken, or it may give up and report the condition as unrecoverable, possibly indicating that a more severe corrective action is required, such as a more general hardware replacement or in-depth diagnostic test.

FIG. 9 is a schematic block diagram of another embodiment of a dispersed storage network (DSN) that includes the distributed storage and task (DST) processing unit 631, which can be an instance of computing device 16 of FIG. 1, the network 24 of FIG. 1, DST integrity processing unit 633, which can be an instance of integrity processing unit 20 of FIG. 1, and a storage unit set 640, which can be an instance of DSN memory 22 of FIG. 1. The storage unit set 640 includes a set of DST execution (EX) units 1-n. Each DST execution unit may be implemented utilizing a storage unit 36 of FIG. 1. Hereafter, each DST execution unit may be interchangeably referred to as a storage unit and the storage unit set may be interchangeably referred to as a set of storage units. The DSN functions to maintain storage unit operation.

In an example of operation of the maintaining of the storage unit operation, one or more DSN units of the DSN, detects a failing storage unit. The detecting includes at least one of issuing a request to the storage unit (e.g., list slice requests from the DST integrity processing unit 633, read slice requests from the DST processing unit 631), receiving an unfavorable response in response to the request (e.g., an error message), and indicating failing when a timeframe has expired since issuing the request without receiving a corresponding response. For example, the DST execution unit 1 detects that DST execution unit 2 is failing based on responses 2 from the DST execution unit 2. As another example, the DST processing unit 631 detects that the DST execution unit 2 is failing based on responses 2 from the DST execution unit 2.

One or more DSN units, for example managing unit 18 of FIG. 1, or computing device 12 of FIG. 1, issues an error indicator to a recovery unit, e.g., the DST integrity processing unit 633, to indicate the failing storage unit. For example, the DST execution unit 1 issues, via the network 24, an error indicator 1 to the DST integrity processing unit 633 with regards to the DST execution unit 2. As another example, the DST processing unit 631 issues, via the network 24, an error indicator DP to the DST integrity processing unit 633 with regard to the DST execution unit 2.

Having received the error indicators, the recovery unit issues a test request to the failing storage unit. The issuing includes generating the test request and sending the test request to the failing storage unit. For example, the DST integrity processing unit 633, having received error indicators DP, 1, etc., issues, via the network 24, test requests 2 to the DST execution unit 2, where the DST execution unit 2 attempts to perform testing associated with the test requests 2 and issues test responses 2 to the DST integrity processing unit 633.

Having received test results, the DST integrity processing 633 determines to implement corrective action based on one or more of receiving an unfavorable test response from the failing storage unit and when a test timeframe has expired since issuing the test request without receiving the test response. For example, the DST integrity processing unit 633 determines to implement the corrective action based on receiving the test responses 2, where the test responses 2 include the unfavorable test response.

Having determined to implement the corrective action, the DST integrity processing unit 20 facilitates execution of the corrective action. The facilitating includes selecting and issuing a corrective action command to the failing storage unit and/or a managing unit, where the corrective action includes one or more of initiating a hardware reset, installing updated software, processing a restart, performing a power cycle, and implementing routine maintenance. The DST integrity processing unit 633 may implement further corrective action when receiving further unfavorable responses in response to the corrective action, where the further corrective action includes one or more of hardware replacement guidance, updates to the network 24 of FIG. 1, and reconfiguration of the DSN.

FIG. 10 is a flowchart illustrating an example of maintaining storage unit operation. The method includes block 650 where a dispersed storage network (DSN) unit detects a failing storage unit. The detecting includes one or more of issuing a request to the storage unit (e.g., a list slice request, a read slice request), receiving an unfavorable response in response to the request (e.g., an error message), and indicating failing when a timeframe has expired since issuing a request without receiving the corresponding response.

The method continues at block 652 where the DSN unit issues an error indicator to a recovery unit to indicate the failing storage unit. For example, the DSN unit sends an error indicator to the recovery unit, where the error indicator indicates one or more of an identity of the failing storage unit and a failure type. The method continues at block 654 where the recovery unit issues a test request to the failing storage unit. The issuing includes generating the test request and sending the test request to the failing storage unit, where the test request includes identity of a test that corresponds to the failure type.

The method continues at block 656 where the recovery unit determines to implement corrective action. The determining may be based on one or more of receiving an unfavorable test response and detecting that a timeframe has expired without receiving a test response. The method continues at block 658 where the recovery unit facilitates execution of the corrective action. For example, the recovery unit issues a corrective action command to the failing storage unit and/or a managing unit and issues a further corrective action command to the failing storage unit and/or managing unit when receiving a further unfavorable response in response to the corrective action.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for use in a dispersed storage network (DSN) including a plurality of storage units, the method comprising:
    issuing an access request from a processing unit included in the DSN to a storage unit of the plurality of storage units;
    identifying, by the processing unit, the storage unit as a failing storage unit based, at least in part, on a rate of growth of a network queue associated with the storage unit; and
    issuing, by the processing unit, an error indicator to a recovery unit for further action.

2. The method of claim 1, further comprising:
    determining, by the processing unit, that the failing storage unit is not responding to at least some access requests.

3. The method of claim 1, wherein the error indicator includes:
    information identifying the failing storage unit and a failure type.

4. The method of claim 1, further comprising:
    issuing, by the recovery unit, a test request to the failing storage unit; and
    determining, by the recovery unit, to implement a corrective action based on a result of the test request.

5. The method of claim 4, wherein issuing the test request includes:
    generating a particular test request based on a failure type associated with the failing storage unit; and
    sending the particular test request to the failing storage unit.

6. The method of claim 4, wherein determining to implement the corrective action includes:
    determining at least one of receiving an unfavorable response to the test request, or determining that a time period has expired without receiving a test response.

7. The method of claim 1, further comprising:
    issuing a corrective action command, by the recovery unit, to a managing unit associated with the failing storage unit.

8. The method of claim 1, wherein the error indicator includes:
    information identifying the failing storage unit as partially non-responsive.

9. A dispersed storage network (DSN) including a plurality of storage units, the DSN comprising:
    a processing unit configured to:
    issue an access request to a storage unit of the plurality of storage units;
    identify the storage unit as a failing storage unit based, at least in part, on a rate of growth of a network queue associated with the storage unit;
    issue an error indicator to a recovery unit, the error indicator indicate the failing storage unit; and
    the recovery unit configured to implement corrective action in accordance with the error indication.

10. The dispersed storage network (DSN) of claim 9, wherein the processing unit is configured to:
    determine that the failing storage unit is not responding to at least some access requests.

11. The dispersed storage network (DSN) of claim 9, wherein the error indicator includes:
    information identifying the failing storage unit and a failure type.

12. The dispersed storage network (DSN) of claim 9, wherein the recovery unit is further configured to:
    issue a test request to the failing storage unit; and
    determine to implement the corrective action based on a result of the test request.

13. The dispersed storage network (DSN) of claim 12, wherein the recovery unit is configured to issue the test request, at least in part, by:
    generating a particular test request based on a failure type associated with the failing storage unit; and
    sending the particular test request to the failing storage unit.

14. The dispersed storage network (DSN) of claim 12, wherein the recovery unit is configured to issue implement the corrective action, at least in part, by:
    determining at least one of receiving an unfavorable response to the test request, or determining that a time period has expired without receiving a test response.

15. The dispersed storage network (DSN) of claim 9, wherein the recovery unit is configured to:

issue a corrective action command to a managing unit associated with the failing storage unit.

16. The dispersed storage network (DSN) of claim 9, wherein the error indicator includes:

information identifying the failing storage unit as partially non-responsive.

17. A processing unit included in a dispersed storage network (DSN) including a plurality of storage units, the processing unit comprising:

a processor;

a memory coupled to the processor;

a non-transitory program of instructions configured to be stored in the memory and executed by the processor, the program of instructions including:

at least one instruction to issue an access request to a storage unit of the plurality of storage units;

at least one instruction to identify, by the processing unit, the storage unit as a failing storage unit based, at least in part, on a rate of growth of a network queue associated with the storage unit; and at least one instruction to issue, by the processing unit, an error indicator to a recovery unit for further action.

18. The recovery unit of claim 17, wherein the at least one instruction to identify includes:

determine that the failing storage unit is not responding to at least some access requests.

19. The recovery unit of claim 17, wherein the error indicator includes:

information identifying the failing storage unit and a failure type.

20. The recovery unit of claim 19, wherein the error indicator includes:

information identifying the failing storage unit as partially non-responsive.

* * * * *